(12) United States Patent
Booth et al.

(10) Patent No.: US 8,894,804 B2
(45) Date of Patent: Nov. 25, 2014

(54) PLASMA UNCONFINEMENT SENSOR AND METHODS THEREOF

(75) Inventors: Jean-Paul Booth, Boullay les Troux (FR); Alexei Marakhtanov, Albany, CA (US); Rajinder Dhindsa, San Jose, CA (US); Luc Albarede, Fremont, CA (US); Seyed Jafar Jafarian-Tehrani, Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 978 days.

(21) Appl. No.: 12/747,491

(22) PCT Filed: Dec. 12, 2008

(86) PCT No.: PCT/US2008/086495
§ 371 (c)(1),
(2), (4) Date: Oct. 21, 2010

(87) PCT Pub. No.: WO2009/076568
PCT Pub. Date: Jun. 18, 2009

(65) Prior Publication Data
US 2011/0128017 A1 Jun. 2, 2011

Related U.S. Application Data

(60) Provisional application No. 61/013,623, filed on Dec. 13, 2007.

(51) Int. Cl.
*C23F 1/00* (2006.01)
*H01J 37/32* (2006.01)

(52) U.S. Cl.
CPC ............... *H01J 37/32935* (2013.01)
USPC ....... 156/345.28; 216/59; 324/72.5; 324/658; 324/655

(58) Field of Classification Search
USPC ............................................ 324/658; 216/59
See application file for complete search history.

(56) References Cited

U.S. PATENT DOCUMENTS 4,006,404 A 2/1977 Szuszczewicz et al.
4,846,920 A * 7/1989 Keller et al. ............. 156/345.25

(Continued)

FOREIGN PATENT DOCUMENTS

JP 08-031806 A 2/1996
JP 2004-335594 A 11/2004

(Continued)

OTHER PUBLICATIONS

"International Preliminary Report on Patentability", Issued in PCT Application No. PCT/US2009/033408; Mailing Date: Aug. 19, 2010.

(Continued)

*Primary Examiner* — Benjamin M Baldridge

(57) ABSTRACT

An arrangement within a plasma reactor for detecting a plasma unconfinement event is provided. The arrangement includes a sensor, which is a capacitive-based sensor implemented within the plasma reactor. The sensor is implemented outside of a plasma confinement region and is configured to produce a transient current when the sensor is exposed to plasma associated with the plasma unconfinement event. The sensor has at least one electrically insulative layer oriented toward the plasma associated with the plasma unconfined event. The arrangement also includes a detection circuit, which is electrically connected to the sensor for converting the transient current into a transient voltage signal and for processing the transient voltage signal to ascertain whether the plasma unconfinement event exists.

29 Claims, 4 Drawing Sheets

(56) References Cited

U.S. PATENT DOCUMENTS

| | | | |
|---|---|---|---|
| 5,759,424 A * | 6/1998 | Imatake et al. | 216/60 |
| 5,861,577 A * | 1/1999 | Tamura et al. | 174/50.56 |
| 5,907,820 A | 5/1999 | Pan | |
| 5,928,528 A | 7/1999 | Kubota et al. | |
| 6,092,027 A | 7/2000 | Takai et al. | |
| 6,416,889 B2 | 7/2002 | Aihara et al. | |
| 6,792,889 B2 * | 9/2004 | Nakano et al. | 118/723 E |
| 7,538,562 B2 * | 5/2009 | Garvin et al. | 324/687 |
| 7,722,778 B2 * | 5/2010 | Fischer et al. | 216/59 |
| 2002/0025388 A1 | 2/2002 | Bhardwaj et al. | |
| 2003/0080755 A1 | 5/2003 | Kobayashi | |
| 2004/0016402 A1 * | 1/2004 | Walther et al. | 118/723 E |
| 2004/0021454 A1 * | 2/2004 | Jevtic et al. | 324/72.5 |
| 2004/0135590 A1 * | 7/2004 | Quon | 324/713 |
| 2004/0223346 A1 | 11/2004 | Rayner et al. | |
| 2005/0034811 A1 * | 2/2005 | Mahoney et al. | 156/345.24 |
| 2005/0151544 A1 * | 7/2005 | Mahoney et al. | 324/655 |
| 2005/0171992 A1 * | 8/2005 | Tanaka et al. | 708/819 |
| 2005/0280372 A1 * | 12/2005 | Anderson | 315/111.21 |
| 2006/0151429 A1 * | 7/2006 | Kitsunai et al. | 216/59 |
| 2006/0171848 A1 * | 8/2006 | Roche et al. | 422/98 |
| 2006/0180570 A1 * | 8/2006 | Mahoney | 216/59 |
| 2006/0249729 A1 * | 11/2006 | Mundt et al. | 257/48 |
| 2006/0275541 A1 | 12/2006 | Weimer | |
| 2007/0052454 A1 | 3/2007 | Gose et al. | |
| 2007/0074812 A1 * | 4/2007 | Mitrovic et al. | 156/345.28 |
| 2007/0074813 A1 * | 4/2007 | Okumura et al. | 156/345.28 |
| 2007/0075036 A1 * | 4/2007 | Moroz | 216/59 |
| 2007/0132507 A1 | 6/2007 | Gatta et al. | |
| 2008/0182417 A1 * | 7/2008 | Collins et al. | 438/710 |
| 2008/0182418 A1 * | 7/2008 | Collins et al. | 438/710 |
| 2008/0249733 A1 * | 10/2008 | Garg et al. | 702/97 |
| 2009/0151871 A1 * | 6/2009 | Pease et al. | 156/345.28 |
| 2010/0096361 A1 * | 4/2010 | Fischer et al. | 216/61 |

FOREIGN PATENT DOCUMENTS

| | | |
|---|---|---|
| JP | 2006-294658 A | 10/2006 |
| KR | 10-2005-0089995 A | 9/2005 |
| KR | 10-2006-006112 A | 6/2006 |
| WO | WO2008/002938 | 1/2008 |

OTHER PUBLICATIONS

"International Search Report", Issued in PCT Application No. PCT/US2009/033408: Mailing Date: Sep. 17, 2009.

"Written Opinion", Issued in PCT Application No. PCT/US2009/033408: Mailing Date: Sep. 17, 2009.

"International Search Report", Issued in PCT Application No. PCT/US2008/086495: Mailing Date: Jun. 24, 2009.

"Written Opinion", Issued in PCT Application No. PCT/US2008/086495; Mailing Date: Jun. 24, 2009.

"International Preliminary Report on Patentability", Issued in PCT Application No. PCT/US2008/086495; Mailing Date: Jun. 24, 2010.

"Non Final Office Action", U.S. Appl. No. 12/101,804, Mailing Date: Oct. 28, 2011.

"Final Office Action", U.S. Appl. No. 12/101,804, Mailing Date: Mar. 23, 2012.

Notification of Reasons for Rejection for Japanese Patent Application No. JP2010-546055 dated Jan. 29, 2013, 11 pages.

* cited by examiner

PLASMA UNCONFINEMENT SENSOR AND METHODS THEREOF

PRIORITY CLAIM

This application is related to and claims priority under 35 U.S.C. §119(e) to a commonly assigned provisional patent application entitled "Plasma Unconfinement Sensor," by Booth et al., Application Ser. No. 61/013,623 filed on Dec. 13, 2007, and under 35 U.S.C. 371 to a PCT Application No. PCT/US2008/086495, filed on Dec. 12, 2008, all of which are incorporated herein by reference.

BACKGROUND OF THE INVENTION

Plasma processing systems have long been employed to process substrates (such as semiconductor wafers) to produce integrated circuits. Plasmas may be generated via many different methods, such as electron-cyclotron-resonance plasmas (ECR), inductively-coupled plasmas (ICP), or capacitive coupled plasmas (CCP). In many cases, confining the plasma to a specific region within the processing chamber, such as within the region directly above the substrate being processed, may provide certain advantages.

To facilitate discussion, FIG. 1 shows an example of a low-pressure plasma reactor 100 during which plasma is confined during processing. Consider the situation wherein, for example, a substrate 124 is placed on an electrode 110, which is mounted to a pedestal 120 that is connected to a chamber 102. Electrode 110 is connected to a remote power supply 114, such as a radio frequency (RF) power generator, through the interior of pedestal 120. A processing gas 150, which may be a mixture of chemicals, may be introduced into chamber 102 through an inlet 104 when the pressure in chamber 102, which may be lowered by a pump (not shown), has reached a desirable level. To process substrate 124, electrode 110 may capacitively couple the power from power supply 114 with processing gas 150 to form a plasma 106. Usually, plasma 106 is contained within a desired region of chamber 102 by a set of confinement rings 108. During substrate processing, gases from plasma 106, which may include a mixture of chemical components from processing gas 150, chemical components formed by reactions within plasma 106, and chemical byproducts from the processing of substrate 124, may flow through confinement rings 108 and a non-plasma chamber volume 128 before being removed from chamber 102 through an outlet 126. This route is illustrated by a path 136 and usually causes the interior of chamber 102 to be exposed to highly reactive gases even when plasma 106 is contained.

However, during processing of substrate 124, plasma 106 may unexpectedly or uncontrollably migrate out of the desired region within chamber 102. In other words, an unconfined plasma 138 may form in a region of chamber 102 that is outside of confinement rings 108. The formation of unconfined plasma 138 is undesirable because unconfined plasma 138 may alter the quality of processing plasma 106 in a way that may cause at least one of the following to occur: significantly degrade the performance on substrate 124, damage chamber 102, and damage pedestal 120. For example, substrate 124 may become damaged due to a change in an etch or deposition rate and/or may be damaged by being contaminated with particulate defects or elemental contamination generated by unconfined plasma 138. Processing chamber 102 and/or pedestal 120 may be physically damaged by, for example, erosion or corrosion of chamber materials as a result of exposure to unconfined plasma 138. In addition, components of processing chamber 102 may experience electrical damage because unconfined plasma 138 may change the path by which plasma power is returned to ground through the chamber. In an example, the plasma power from power supply 114 may return to ground through chamber components which may not be designed to carry plasma power.

As can be appreciated from the foregoing, plasma unconfinement events may be caused by many different factors. For example, a plasma may become unconfined if the plasma becomes unstable. In another example, a plasma unconfinement event may occur if electrical arcing occurs within the processing chamber. In yet another example, a plasma may become unconfined if processing parameters, such as plasma power, plasma composition, gas supply flows, operating pressure, and the like, fluctuate.

Also, the occurrence of the plasma unconfinement events may be sporadic and may tend to be unpredictable. One reason for the unpredictability is that the unconfined plasma may have different forms. In addition, the specific effects that a plasma unconfinement event may have on substrate processing generally cannot be anticipated due to the variable and unpredictable form exhibited by unconfined plasma. For example, an unconfined plasma may have low density or high density. In another example, the space occupied by the unconfined plasma may be large or small. In yet another example, an unconfined plasma may be a stable plasma or may be a fluctuating, sporadic plasma. Even the location of the unconfined plasma within the reactor may change during processing.

Various methods have been employed to detect plasma unconfinement events. One method includes utilizing an electrostatic probe that usually has multiple electrodes, such as a VI probe or a Langmuir probe to detect a plasma unconfinement event. In an example, a Langmuir-style probes, which may be unprotected electrodes (usually made from metal), may be exposed to the chamber environment. Since the Langmuir-style probe are typically electrically biased such that when the probe is exposed to plasma a direct current (DC) can flow from the plasma to the electrode. For example, a Langmuir-style probe 122 is positioned within the plasma environment that is outside of the desired plasma confinement region. By employing a current detector 148, DC current changes on Langmuir-style probe 122 via a power supply 118 may be detected. Also, a DC power supply (not shown) may be employed to bias the probe.

However, the operational requirements of Langmuir-style probes (i.e. that the electrodes are unprotected and that a DC electrical contact with the plasma exist) limit the utility of the Langmuir-style probes in detecting plasma unconfinement events. Also, due to the unpredictable nature of the plasma unconfinement events, the Langmuir-style probes may have to be operating continuously while the substrate is being processed in order to be effective. However, continuous usage may result in exposing the unprotected electrodes of the Langmuir-style probes to the mixture of chemical species that is usually present in the reactor chamber during plasma processing. The mixture of chemical species, which includes chemicals supplied for processing of the substrate, new chemical species generated within the processing plasma, and chemical byproducts formed during the processing of the substrate, typically includes both corrosive components and depositing components that may detrimentally affect the ability of Langmuir-style probes to function properly. In an example, corrosive components (e.g. chlorine, fluorine, and bromine, etc.) may cause the electrodes to corrode, thereby causing the Langmuir-style probe to not function properly, such as failing to timely and/or accurately detect a plasma unconfinement event. In addition, corroded electrodes may become a source of particulate defects and/or metallic contamination that may indirectly damage the substrate being processed. In another example, the depositing components of the mixture (e.g. inorganic SiOx-based byproducts and organic CFx-based polymerizers) may result in the formation of an electrically-insulating film on the electrodes of the probe: thus, the film may interfere with the required plasma-electrode DC contact, thereby preventing the probe from accurately and/or timely sensing the presence of a plasma. As can be appreciated from the foregoing, the Langmuir-style probes may not be ideal in detecting plasma unconfinement events.

Another method that has been employed is to identify the changes in the bias voltage of a substrate during processing to detect plasma unconfinement events. With reference to FIG. 1, a bias voltage on substrate 124 may be produced when power provided by power supply 114 interact with plasma 106 within reactor 100. Typically a sensor 140 may be installed (e.g. in electrode 110) to allow direct measurement of the bias voltage on substrate 124 during processing and a bias voltage detector 144 may be employed to compare the bias voltage against a threshold. Thus, when the characteristic of plasma 106 is altered due to unconfined plasma 138, sensor 140 may be employed to measure the bias voltage and bias voltage detector 144 may be employed to detect the changes in the bias voltage.

Additionally or alternatively, a change in the bias voltage may be indirectly detected by measuring changes in parameters which are related to the substrate bias voltage. For example, when the substrate bias voltage changes because of unconfined plasma 138, the power supplied by power supply 114 to electrode 110 to maintain plasma 106 may also change. Therefore, monitoring the power supplied to plasma 106 with a RF power detector 142 may allow detection of plasma unconfinement events.

However, the utility of monitoring bias voltage to detect plasma unconfinement events is limited by the difficulty in detecting changes in the bias voltage caused by plasma unconfinement events. Detecting changes in bias voltage is particularly difficult when higher frequency generators (such as 60 MHz) are utilized to generate a plasma. Bias voltage generated by higher frequency generators are small and since a plasma unconfinement event usually occur at lower power levels, differentiating the plasma unconfinement event from the changes in the DC bias signal may be difficult or impossible to detect. Therefore the utility of this technique is limited because of the inability to reliably detect plasma unconfinement events.

In yet another prior art approach, an optical sensor may be used to detect plasma unconfinement events. Those skilled in the art are aware that plasma generally emits light. Thus, an optical sensor may be employed to detect the light emitted from an unconfined plasma. In an example, with reference to FIG. 1, an optical sensor 132 may be installed adjacent to a transparent window 130 with a line-of-sight into an area of chamber 102 in which monitoring is desired (denoted here as a passage 134). Thus, when plasma 106 becomes unconfined plasma 138, light from unconfined plasma 138 may enter passage 134 and may pass through window 130 to be detected by optical sensor 132. Upon detecting the light, optical sensor 132 may send a signal to an optical signal detector 146. If the signal is above a pre-defined threshold, optical signal detection 146 may provide an alert indicating that unconfined plasma 138 has been detected.

However, employing the optical sensors to detect plasma unconfinement events may be limited because detecting the light emitted from unconfined plasma 138 may be difficult because the light emitted by unconfined plasma 138 is significantly dimmer than the light emitted from processing plasma 106. In addition, the positioning of optical sensor 132 outside of chamber 102 may make "seeing" the light difficult through transparent window 130 since the reactive chemicals may cause transparent window 130 to be less than transparent. In other words, the reactive chemicals may cause a layer of films to be deposited on transparent window 130, thereby significantly reducing the amount and/or quality of light that be detected by optical sensor 132. Furthermore, the utility of optical sensors is dependent upon having viewing access into the processing environment. However, placing windows and/or viewing passages in all locations that may have to be monitored may not always be feasible.

Although various methods have been implemented, each of the methods does not provide a dependable and comprehensive solution for detecting plasma unconfinement events. In an example, the Langmuir-style probe is susceptible to corrosion, which may negatively impact the probe effectiveness in identifying plasma unconfinement events. In another example, depending upon identifying changes in the bias voltage to determine plasma unconfinement event may be dependent upon differentiating the changes in DC bias signal from a plasma unconfinement event. The ability to differentiate the two may be difficult when the DC bias signal is being generated by a higher frequency generator (such as 60 MHz) while the unconfined plasma is occurring at a lower power level. In yet another example, utilizing optical sensors to detect light emitted from unconfined plasma is limited by the availability of viewable passage and/or the inability to detect the light due to the obstruction that may cause the viewable passage "unviewable".

BRIEF SUMMARY OF THE INVENTION

The invention relates, in an embodiment, to an arrangement within a plasma reactor for detecting a plasma unconfinement event. The arrangement includes a sensor, which is a capacitive-based sensor implemented within the plasma reactor. The sensor is implemented outside of a plasma confinement region and is configured to produce a transient current when the sensor is exposed to plasma associated with the plasma unconfinement event. The sensor has at least one electrically insulative layer oriented toward the plasma associated with the plasma unconfined event. The arrangement also includes a detection circuit, which is electrically connected to the sensor for converting the transient current into a transient voltage signal and for processing the transient voltage signal to ascertain whether the plasma unconfinement event exists.

The above summary relates to only one of the many embodiments of the invention disclosed herein and is not intended to limit the scope of the invention, which is set forth in the claims herein. These and other features of the present invention will be described in more detail below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE PREFERRED EMBODIMENTS

Figure 1:
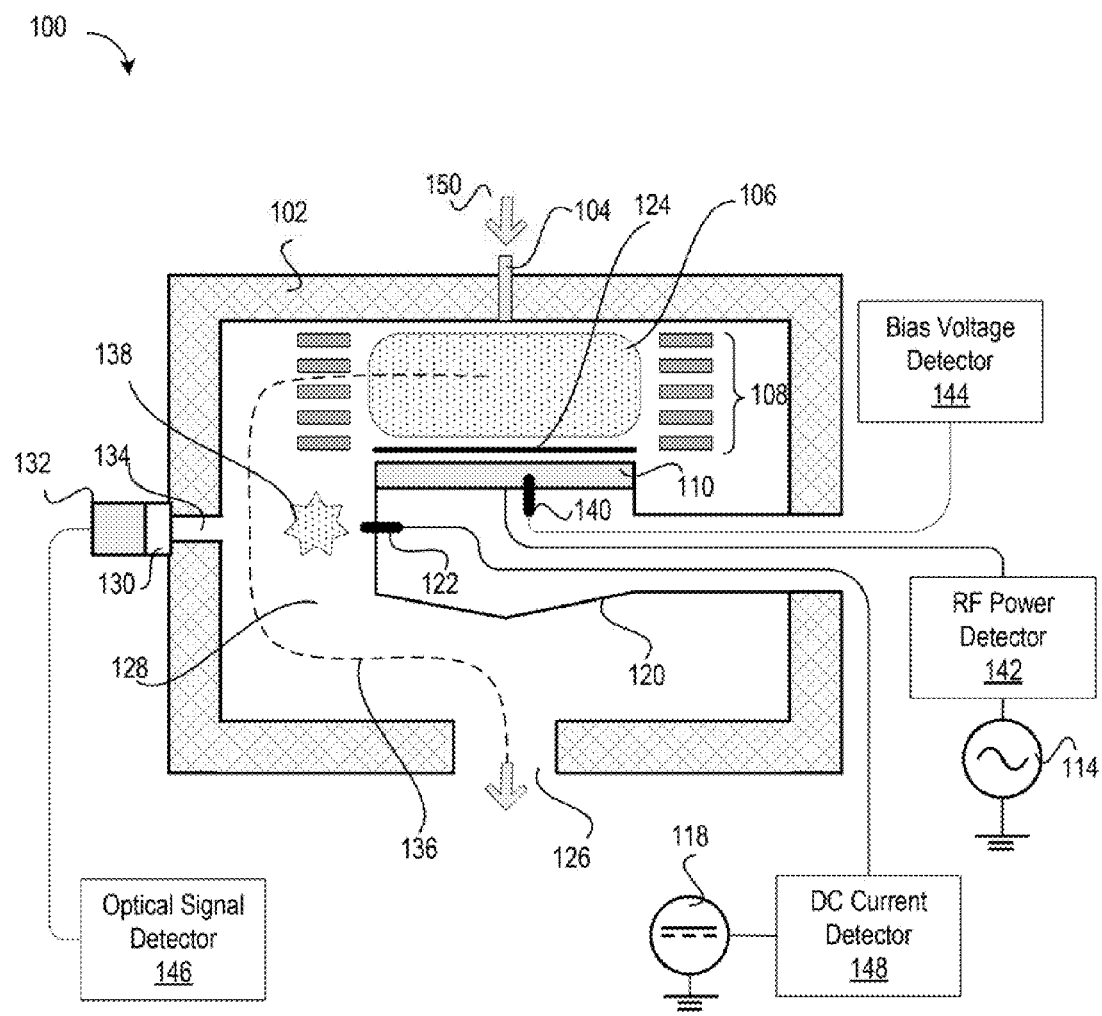
FIG. 1 shows an example of a prior art plasma processing chamber in which the plasma is confined during processing, and illustrates current strategies for detecting plasma unconfinement events.

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

Various embodiments are described hereinbelow, including methods and techniques. It should be kept in mind that the invention might also cover articles of manufacture that includes a computer readable medium on which computer-readable instructions for carrying out embodiments of the inventive technique are stored. The computer readable medium may include, for example, semiconductor, magnetic, opto-magnetic, optical, or other forms of computer readable medium for storing computer readable code. Further, the invention may also cover apparatuses for practicing embodiments of the invention. Such apparatus may include circuits, dedicated and/or programmable, to carry out tasks pertaining to embodiments of the invention. Examples of such apparatus include a general-purpose computer and/or a dedicated computing device when appropriately programmed and may include a combination of a computer/computing device and dedicated/programmable circuits adapted for the various tasks pertaining to embodiments of the invention.

In accordance with embodiments of the invention, a plasma unconfinement sensor, such as a capacitive-based sensor, is provided for detecting plasma unconfinement events within a plasma processing system. Embodiments of the invention include a sensor that is insensitive to corrosion and deposits that typify a plasma processing environment. Embodiments of the invention also include the sensor to be attached to a detection circuit, which is configured at least to make a determination of an unconfinement event within the plasma processing system.

In an embodiment, the sensor may include an electrically conductive substrate protected by one or more electrically insulative layers, in an embodiment. When the sensor is exposed to an unconfinement event, the transient current that is developed across the electrically insulative layers may flow through the sensor to a circuit converter. The circuit converter is configured, in an embodiment, to translate the transient current into a transient voltage signal. The transient voltage signal may be sent through a low pass filter circuits to improve the signal-to-noise characteristics, such as to remove the high-frequency components from the transient voltage signal. Additionally or alternatively, the transient voltage signal may be sent through a set of resonance filters (such as LC filters), which is configured to at least remove additional frequencies. Once the transient voltage signal has been conditioned, the signal may be compared to a pre-defined threshold to determine the existence of a plasma unconfinement event.

As can be appreciated from the foregoing, since the sensor is configured to be insensitive to corrosion or deposition that may occur during plasma processing, the sensor can be continuously operating during plasma processing, thereby improving the likelihood and timeliness of uncoupled plasma event detection. Further, the detection circuit enables the transient current sensed by the sensor to be translated into a clear and robust signal that can be employed to determine the existence of a plasma unconfinement event.

The features and advantages or the present invention may be better understood with reference to the figures and discussions that follow.

Figure 2:
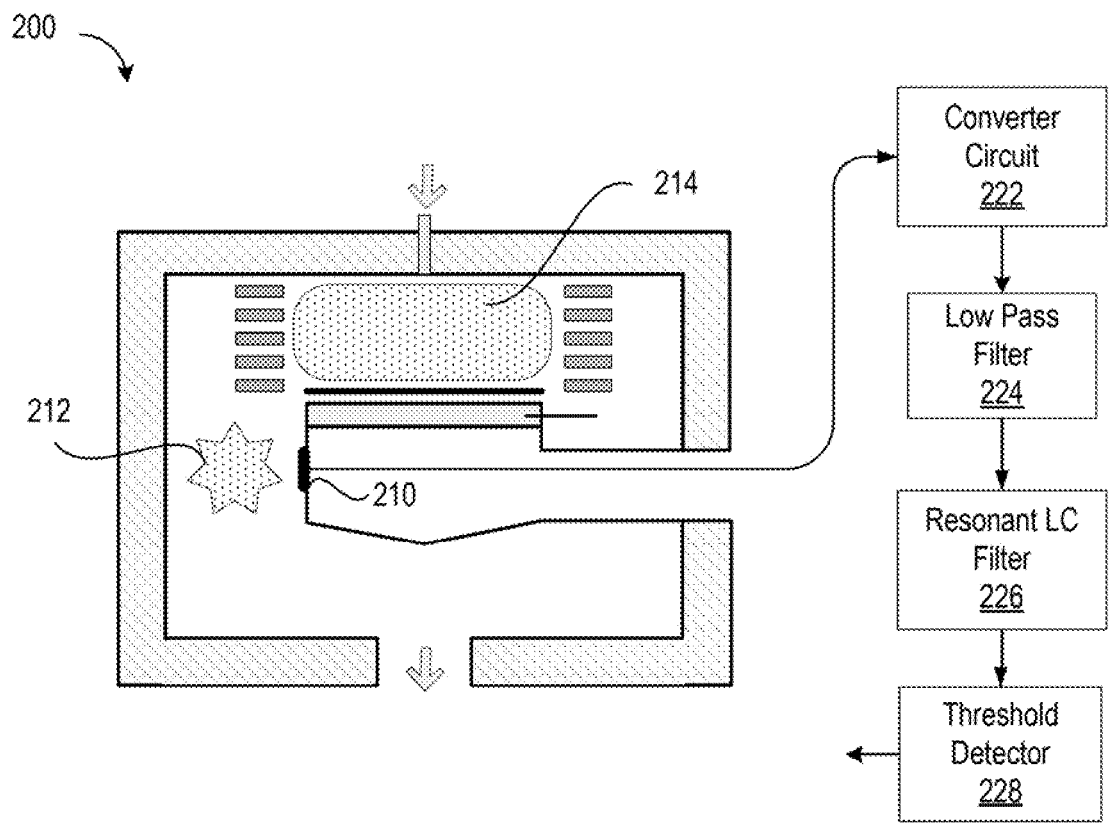
FIG. 2 shows, in accordance with an embodiment of the present invention, a simple schematic of a plasma reactor during plasma processing.

FIG. 2 shows, in accordance with an embodiment of the present invention, a simple schematic of a plasma reactor 200 during plasma processing. Plasma reactor 200 may include an electrode 210 (e.g., capacitive-based sensor), which is configured to be positioned within a region in which detection of plasma unconfinement events is desired. In other words, the region may be outside of a plasma confinement region 214. In an example, electrode 210 may be mounted in a manner that enables the outer surface of electrode 210 to be exposed to unconfined plasma, such as unconfined plasma 212.

Due to the inherent characteristic of plasma, surfaces exposed to a plasma may develop an electrical charge as a result of the difference in velocity of the lighter plasma components (e.g. electrons) interacting with the heavier plasma components (e.g. molecular ions). Thus, when electrode 210 is exposed to unconfined plasma 212, the outer surface of electrode 210 may undergo a charging process. The outer electrode 210 surface may charge negatively or positively, depending on the particular characteristics of unconfined plasma 212. Usually, the charging process is a transient process since the charging process usually occurs until the outer surface of electrode 210 has achieved an amount of charge which is at equilibrium with unconfined plasma 212.

In an embodiment, while the transient charging process of the outer surface of electrode 210 is occurring, a transient charge with a charge that is opposite of the outer surface transient charge may be induced within electrode 210. In order to timely identify the existence of unconfined plasma, the transient current induced by the transient charge is converted into a transient voltage signal by a conversion circuit 222. Since the transient voltage signal may include by noise, a low-pass filter 224 may be utilized to remove the noise. In an example, low-pass filter 224 may be employed to remove high frequency components (e.g. high-frequency noise) thereby improving the transient voltage signal. To transform the transient voltage signal into a conditioned signal, in an embodiment, a set of resonance LC filter 226 may be employed to block specific frequencies, such as those typically used to generate plasma. The conditioned signal may then be forwarded to a threshold detector 228, which may be configured to compare the conditioned signal against a pre-defined threshold. If the conditioned signal is above the pre-defined threshold, threshold detector 228 may generate an alert indicating that unconfined plasma has been detected, thereby enabling appropriate action to be taken (e.g., the plasma may be turned off and processing of the substrate stopped).

Figure 3A:
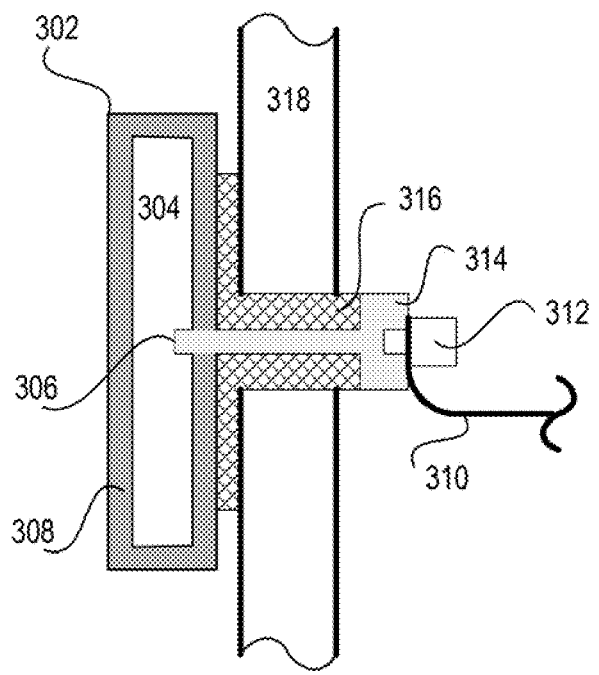
FIG. 3A shows, in an embodiment of the invention, an implementation of capacitive-based sensor.

FIG. 3A shows, in an embodiment of the invention; an implementation of a capacitive-based sensor. As mentioned in FIG. 2, a capacitive-based sensor 302 may be physically mounted on a chamber wall 318 of a plasma reactor. In an embodiment, capacitive-based sensor 302 may include at least two components: an electrically insulative outer layer 308 and an electrically conducting substrate 304. In an embodiment, capacitive-based sensor 302 is electrically isolated from the mounting surface via an insulator 316. When a transient charge is generated due to an unconfined plasma, the transient current may be sent along to a conducting contact 314, which is coupled to electrically conducting substrate 304 via an electrical contact 306. The transient charge may be sent to a detection circuit (not shown) via a wire 310, which may be secured to conducting contact 314 via a clamp 312.

Electrically conducting substrate 304 may be made from a variety of materials. In an embodiment, electrically conductive substrate 304 may be made from electrically conducting material, such as a metal (e.g. Al, Cu, Ag, Au, Fe-based, etc.) or a combination/alloy of metals. Electrically conductive substrate 304, in an embodiment, may also be made from a semiconducting material, such as highly-doped silicon, for example. In an embodiment, electrically conductive substrate 304 may be made from a conductive ceramic material (e.g. silicon carbide) or a combination of conductive ceramics. Additionally or alternatively, electrically conductive substrate 304 may be made from either a conductive polymer or a non-conductive polymer, in an embodiment. In an example, the conductive polymer may include but are not limited to an organic polymer containing electrically conductive "fillers", an organic polyaniline-based polymer, and a mixture of a polyanyline-based polymer. In yet another embodiment, electrically conductive substrate 304 may be made from an electrically conductive inorganic polymer, such as conductive silicone, for example. As can be appreciated from the foregoing, electrically conductive substrate 304 may be made from a combination of any or all of the above electrically conductive materials.

In an embodiment, electrically insulative outer layer 308 may be made from an electrically-insulative material, such as a form of $SiO_2$ (e.g. quartz or glass), a ceramic (e.g. $Al_2O_3$), a commercial polymer (e.g. PTFE, polyimide, silicone, etc.), a polymer that is a byproduct of the plasma process (e.g. a CFx-based polymer), or a combination of any or all of the above. Electrically insulative outer layer 308 may be made of an electrically-insulating material that may be compatible with the mixture of chemicals and plasma that may be typically used within the plasma reactor, in an embodiment. In an example, anodized aluminum is a common component that may be found within a plasma etch reactor (such as that illustrated in FIG. 1) since anodized aluminum is relatively inert to the chemicals typically used for substrate processing. Therefore, electrically insulative outer layer 308 made from electrically-insulating materials, such as anodized aluminum, that are compatible with the chemicals utilized during plasma processing may make the sensor protected by the electrically insulative outer layer (308) insensitive to the plasma environment and prevent the electrically insulative outer layer from becoming a source of metal or particulate defects.

In another embodiment, electrically insulative outer layer 308 may be grown from electrically conductive substrate 304. In an example, anodized aluminum that may characterize electrically outer layer 308 may be grown from an aluminum substrate. In another example, electrically insulative outer layer 308 may be grown from the film deposited on electrically conductive substrate 304. The film may be deposited by a plurality of common deposition techniques, including chemical vapor deposition, plasma enhanced chemical vapor deposition, sputtering, and the like. In yet another example, electrically insulative outer layer 308 may be applied onto electrically conductive substrate 304 by a plurality of common application techniques, such as thermal spraying, sintering, thermal bonding, and the like.

The thickness of electrically insulative outer layer 308 may vary depending upon the type of insulative material. In an embodiment, the thickness of electrically insulative outer layer 308 has to be sufficiently thick to electrically insulate electrically conductive substrate 304 while still enabling an appropriate capacitance to be generated when capacitive-based sensor 302 is exposed to a plasma in order to create a measurable voltage that is detectable in the detection circuit. In one embodiment, the thickness of the film may range from 10 to 100 micrometers.

Figure 3B:
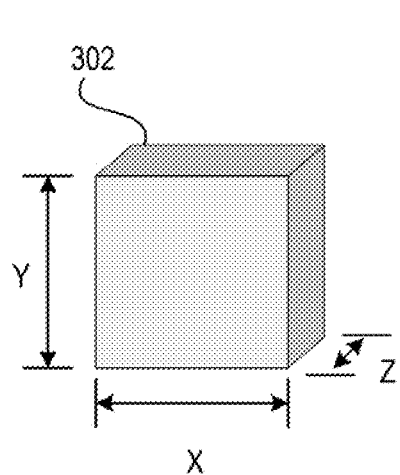
FIG. 3B shows, in an embodiment of the invention, an example of a rectangular capacitive-based sensor.
Figure 3C:
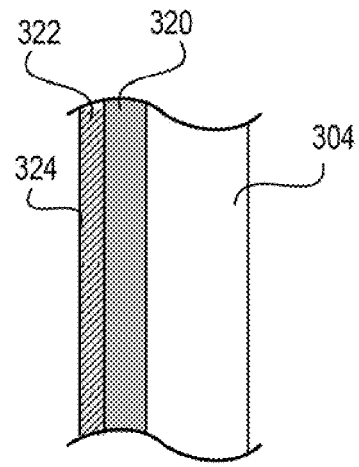
FIG. 3C shows, in an embodiment of the invention, an example of a cross-section of a sensor with two electrically insulative outer layers.

As can be appreciated from the foregoing, the number of electrically insulative outer layer that may be applied to electrically conductive substrate 304 may vary as long as the set of electrically insulative outer layers electrically isolate electrically conductive substrate 304 from the sensor's (302) outer surface 324, which is exposed to the unconfined plasma. To illustrate, FIG. 3C shows, in an embodiment of the invention, an example of a cross-section of a capacitive-based sensor 302 with two electrically insulative outer layers, 320 and 322. In an example, electrically insulative outer layer 322 may be applied onto electrically insulative outer layer 320 as part of the fabrication of capacitive-based sensor 302. In this example, electrically insulative outer layer 320 may become an 'intermediate glue layer' to improve the adhesion of electrically insulative outer layer 322 onto electrically conductive substrate 304. In another example, electrically insulative outer layer 320 may have a coefficient of thermal expansion which is in-between electrically insulative outer layer 322 and electrically conductive substrate 304. The thermal expansion coefficient may enable capacitive-based sensor 302 to be more resistant to cracking or flaking due to the effects of thermal cycling.

In a third example, electrically insulative outer layer 322 may represent a layer of deposition that has formed on an electrically insulative outer layer 320 due to exposure to reactive gases that are present in the processing chamber while the substrate is being processed. Because capacitive-based sensor 302 may operate like a capacitor, capacitive-based sensor 302 may be insensitive to the formation of an additional layer on the surface of the sensor. According, unlike Langmuir-type probes, the formation of an electrically insulative outer layer does not eliminate the ability of the sensor to detect unconfined plasmas.

Referring back to FIG. 3A, the specific combination of insulator 316, conductor contact 314, and clamp 312 may be custom-made for a particular application, or may be replaced by any number of commercial vacuum feed-through devices.

Additionally, capacitive-based sensor 302 may be mounted to the chamber in many different ways. In an embodiment, capacitive-based sensor 302 may be mounted within close proximity to chamber wall 318, as shown in FIG. 3A. In another embodiment, capacitive-based sensor 302 may be flush with chamber wall 318. In yet another embodiment, capacitive-based sensor 302 may be mounted away (such as on the end of a rod or a pedestal) from chamber wall 318.

In an embodiment, capacitive-based sensor 302 may be of different geometrical shape. As can be appreciated from the foregoing, the shape of capacitive-based sensor 302 may be based on a manufacturer's preference or may be dependent upon mounting location. In an embodiment, as shown in FIG. 3B, capacitive-based sensor 302 may be a rectangular "button", with x and y dimensions of around one inch and a thickness z of, 0.05". In another embodiment, capacitive-based sensor 302 may be annular in shape, such as a ring, to account for the other components within the environment, such as a circular pedestal or a circular chamber. Usually, the sensitivity is proportional to the surface area of the probe in contact with the unconfined plasma (which may not occupy the whole exterior volume). Accordingly, a larger probe may provide a larger signal, but may also capture more noise. Furthermore, a very large probe may risk perturbing the normal plasma process, for example by changing the RF current return path. Thus, the shape and size of the sensor may depend upon a manufacturer's preference given the criteria discussed above.

As aforementioned, once the transient current has been generated, the transient current may be sent to a detection circuit to determine the existence of an unconfined plasma. The next few figures (FIGS. 4A and 4B) are examples of the flow of the transient circuit to the detection circuit.

Figure 4A:
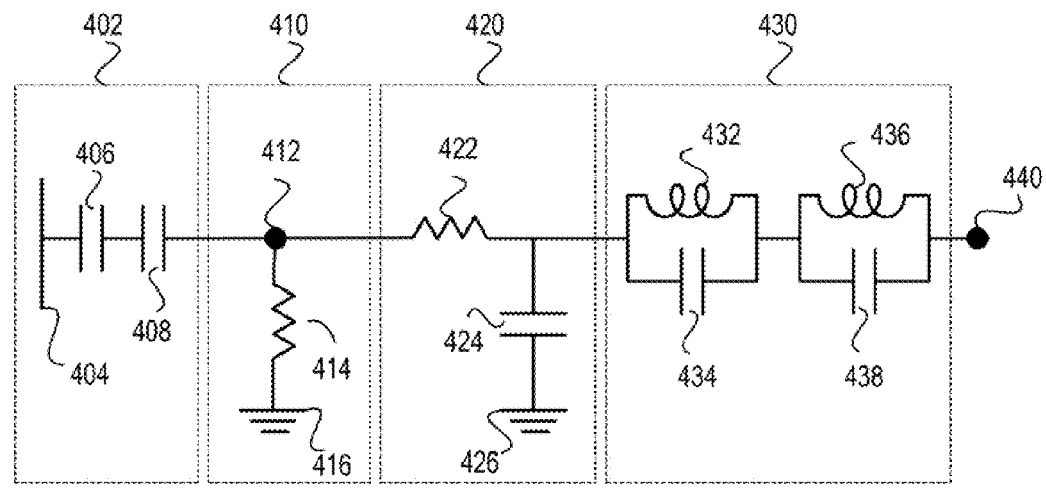
FIGS. 4A and 4B are schematic views of embodiments of plasma detection circuits.

FIG. 4A shows, in an embodiment of the invention, an example electrical model of both a capacitive-based sensor and a detection circuit. A box 402 shows an example circuit model for a capacitive-based sensor. The outer surface of the capacitive-based sensor (the surface which is exposed to a plasma) is represented by a plate 404. Capacitors 406 and 408 each represents electrically insulative outer layers which may be present on the electrically conductive substrate of the capacitive-based sensor. As can be appreciated from the foregoing, additional layers on the electrically conductive substrate may be shown as additional capacitances in the electrical model (and vice versa). In an embodiment, the capacitance of the set of electrically insulative outer layers on the electrically conductive substrate is the dominant capacitance. In other words, the additional capacitance due to the formation of layers of plasma deposition products may be large relative to the capacitance of the outer layers of the detector, since the smallest capacitors in a series is the dominant one. Usually, a typical capacitance value of the film may be about 0.1 nF per square centimeter of the surface area.

Boxes 410, 420, and 430 show an example circuit model for a detection circuit. Box 410 shows an example of a model for a current-to-voltage converter (i.e., circuit converter). The current-to-voltage converter is configured to convert the transient current generated from an electrical charge due to exposure of the plate 404 to a plasma. In an example, the transient current that develop across capacitors 406 and 408 due to the exposure to the plasma may flow to an electrical ground 416 via a resistor 414, thereby converting the transient current into to a transient voltage signal, which may be read at point 412. In an embodiment, resistor 414 may have a value of between 1-100 kohms.

The transient voltage signal generated at point 412 may then be conditioned to improve signal-to-noise characteristics. In an embodiment, the transient voltage signal may pass through a low pass filter circuit, such as the example circuit shown in box 420. In an embodiment, low pass filter 420 may include, but are not limited to a resistor 422 connected to a capacitor 424, which is connected to a ground 426. The combination of elements 422 and 424 serve to remove high-frequency components from the transient voltage signal. In an embodiment, resistor 422 may have a value of 100 ohms and capacitor 424 may have a value of about 100 nF.

The signal to noise characteristics of the transient voltage signal may be further improved by passing the transient voltage signal through a set of resonance LC filters, such as the two examples presented in Box 430, in an embodiment. The first LC filter may include an inductor 432 in parallel with a capacitor 434. Similarly, the second LC filter may include an inductor 436 in parallel to a capacitor 438. With the set of resonance LC filters, the transient voltage signal may be improved by removing selectively blocking known and/or expected frequencies. For example, if a process plasma is powered by two separate RF generators that operate at different frequencies (e.g., 13.56 MHz and 28 MHz), the transient voltage signal generated from a capacitive-based sensor exposed to a plasma may include both frequencies. Since the magnitude of these frequencies may interfere with the detection of the transient voltage signal, the set of resonance LC filters may be employed to block the frequencies. In an example, inductor 432 in parallel with capacitor 434 may block the 13.56 MHz component and inductor 436 in parallel with capacitor 438 may block the 28 MHz component. Typically, the type of frequencies (e.g., 2, 27 and 60 MHz) that may be commonly utilized may be the types of frequencies that may be blocked. However, the set of resonance LC filters are not limited to blocking just the aforementioned frequencies and may block a range of frequencies (e.g., 500 kHz to 200 MHz). As can be appreciated from the foregoing, the type of frequencies that may be blocked may depend upon the user's preference.

Once the transient voltage signal has been filtered, a conditioned signal may be generated at a point 440. In an embodiment, the conditioned signal (i.e., the output from resonance LC filter box 430) may be sent to a threshold detector (not shown). The threshold detector may compare the conditioned signal to a pre-determined threshold to determine if a plasma unconfinement event has occurred.

Figure 4B:
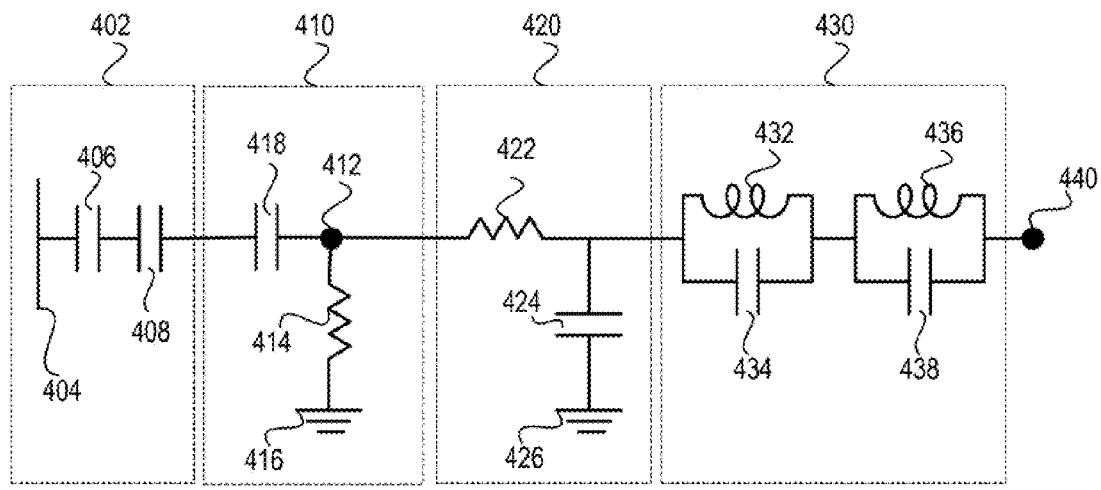

Alternatively, the detection circuit may be implemented as shown in FIG. 4B. The detection circuit as shown in FIG. 4B is similar to the detection circuit of FIG. 4A except for an additional capacitor 418. In an embodiment, capacitor 418 may be implemented within the current-to-voltage converter of box 410. Since capacitive-based sensor in box 402 may sometime experience short-circuit, capacitor 418 may provide some protection for the downstream components of the detection circuit (i.e. boxes 420, 430, threshold detector, etc.) from being damaged. In an embodiment, capacitor 418 may have a value of 100 nF. In an example, if the set of outer layers of the capacitive-based sensor become damaged such that the electrically insulative characteristic of the capacitive-based sensor is compromise, model capacitors 406 and 408 in box 402 are replaced by a direct electrical connection between the capacitive-based sensor (i.e. plate 404) and the detection circuit components, which are connected to point 412 in box 410, the detection circuit may also be short-circuited and be damaged. However, with capacitor 418, a direct connection between the plasma and the detection components may be prevented, thereby preventing the detection circuit from being damaged. In addition, even if capacitor 418 becomes exposed to the unconfined plasma due to the short-circuit situation, the transient voltage signal generated is detectably different from the transient voltage signal that is associated with a non-short-circuited sensor. As a result, the threshold detector is able to differentiate between the two types of transient voltage signal and may even be able to make a determination that the capacitive-based sensor has been damaged.

As can be appreciated from the forgoing, one or more embodiments of the present invention provide for a plasma unconfinement sensor for detecting unconfined plasma. By having a set of electrically insulative outer layers protecting the conduction substrate of the plasma unconfinement sensor, the plasma unconfinement sensor is protected from the plasma environment, thereby enabling the plasma unconfinement sensor to perform without experiencing performance degradation due to corrosion to critical sensor components and/or deposition of electrically insulating Films on the conducting substrate of the sensor. With a detection circuit capable of filtering out extraneous noise from the voltage signal, the voltage signal may be of higher quality; thus, providing the threshold detector with a clear signal from which a plasma unconfinement event may be determined.

While this invention has been described in terms of several preferred embodiments, there are alterations, permutations, and equivalents, which fall within the scope of this invention. Although various examples are provided herein, it is intended that these examples be illustrative and not limiting with respect to the invention.

Also, the title and summary are provided herein for convenience and should not be used to construe the scope of the claims herein. Further, the abstract is written in a highly abbreviated form and is provided herein for convenience and thus should not be employed to construe or limit the overall invention, which is expressed in the claims. If the term "set" is employed herein, such term is intended to have its commonly understood mathematical meaning to cover zero, one, or more than one member. It should also be noted that there are many alternative ways of implementing the methods and apparatuses of the present invention. It is therefore intended that the following appended claims be interpreted as including all such alterations, permutations, and equivalents as fall within the true spirit and scope of the present invention.

What is claimed is:

1. A system comprising:
    a sensor, wherein
        said sensor is a capacitive-based sensor and is configured to be implemented within a plasma reactor and outside of a plasma confinement region,
        said sensor is configured to produce a transient current when said sensor is exposed to plasma associated with a plasma unconfinement event,
        said sensor comprises an outer layer and an outer surface,
        said outer layer comprises at least one electrically insulative layer disposed on a conductive substrate, wherein said outer layer surrounds said conductive substrate or is partially disposed between said substrate and a chamber wall of said plasma reactor, and
        said outer surface is oriented toward said plasma associated with said plasma unconfined event; and
    a detection circuit electrically connected to said sensor and configured to convert said transient current into a transient voltage signal and process said transient voltage signal to indicate whether said plasma unconfinement event exists.

2. The system of claim 1, wherein:
    said detection circuit includes a voltage converter; and
    said voltage converter is configured to convert said transient current into said transient voltage signal.

3. The system of claim 2, wherein:
    said detection circuit includes a low-pass filter; and
    said low-pass filter is configured to remove high-frequency components from said transient voltage signal.

4. The system of claim 3, wherein:
    said detection circuit further includes a set of resonance filters; and
    said set of resonance filters is configured to block frequencies associated with generating process plasma and generate a conditioned signal.

5. The system of claim 4, wherein:
    said detection circuit further includes a threshold detector; and
    said threshold detector is configured to identify when said plasma unconfinement event has occurred by comparing said conditioned signal to a threshold.

6. The system of claim 1, wherein said detection circuit comprises:
    a voltage converter configured for converting said transient current into said transient voltage signal;
    a low-pass filter configured for removing high-frequency components from said transient voltage signal;
    a set of resonance filters configured for blocking frequencies associated with generating process plasma and generating a conditioned signal; and
    a threshold detector configured to indicate whether said plasma unconfinement event exists.

7. The system of claim 6, wherein:
    said voltage converter includes a capacitor; and
    said capacitor is connected between said sensor and components downstream from said capacitor such that there is no direct connection between said sensor and said components downstream from said capacitor, thereby protecting said components downstream from said capacitor from a short-circuit experienced by said sensor.

8. The system of claim 7, wherein said low pass filter includes a resistor coupled to a grounded capacitor.

9. The system of claim 8, wherein at least one resonance filter of said set of resonance filters includes an inductor in parallel with a second capacitor.

10. The system of claim 6, wherein:
    said sensor is mounted on a rod;
    said rod is attached to said chamber wall of said plasma reactor; and
    said rod is electrically isolated from said chamber wall.

11. The system of claim 1, wherein said conductive substrate comprises at least one of a metal, an alloy, a semiconducting material, a conductive ceramic material, and a polymer.

12. The system of claim 1, wherein said outer layer comprises at least one of a glass material, a quartz material, a ceramic material, a polymer material, and an anodized aluminum.

13. The system of claim 1, wherein said at least one electrically insulative layer comprises:
    a first insulative layer having a corresponding first capacitance; and
    a second insulative layer having a corresponding second capacitance,
    said first capacitance and said second capacitance are connected in series between said outer surface of said outer layer and said detection circuit.

14. The system of claim 1, wherein said at least one electrically insulative layer surrounds said substrate.

15. The system of claim 14, wherein:
    said sensor comprises a contact; and
    said contact extends through said chamber wall of said plasma reactor, through said outer layer, and connects to said substrate.

16. The system of claim 15, wherein:
    said substrate is connected to a wire via said contact; and
    said substrate receives a transient charge from said plasma via said at least one electrically insulative layer without prior passage of said transient charge via an electrode.

17. The system of claim 15, wherein:
    said conductive substrate extends outward away from said contact such that a portion of said outer surface is exposed to said plasma; and
    wherein said portion of said outer surface faces said chamber wall.

18. The system of claim 1, further comprising an insulator disposed (i) between said substrate and said chamber wall of said plasma reactor, and (ii) between said outer layer and said chamber wall.

19. The system of claim 18, wherein:
a first portion of said outer layer comprises said outer surface;
said outer surface is exposed to said plasma; and
a second portion of said outer layer is disposed between said substrate and said chamber wall.

20. A method for detecting a plasma unconfinement event during plasma processing within a plasma reactor, said method comprising:
detecting, via a sensor, a transient current when said sensor is exposed to plasma associated with said plasma unconfinement event, wherein
said sensor is a capacitive-based sensor implemented within said plasma reactor and outside of a plasma confinement region,
said sensor comprises an outer layer and an outer surface,
said outer layer comprises at least one electrically insulative layer, wherein said outer layer surrounds a substrate or is partially disposed between said substrate and a chamber wall of said plasma reactor, and
said outer surface is oriented toward said plasma associated with said plasma unconfined event;
converting said transient current into a transient voltage signal by a detection circuit, wherein said detection circuit is electrically connected to said sensor; and
processing said transient voltage signal to indicate whether said plasma unconfinement event exists.

21. The method of claim 20, wherein:
said converting of said transient current into said transient voltage signal is performed by a voltage converter; and
said detection circuit comprises said voltage converter.

22. The method of claim 21, wherein:
said processing of said transient voltage signal includes removing high frequency components via a low-pass filter; and
said detection circuit comprises said low-pass filter.

23. The method of claim 22, wherein:
said processing of said transient voltage signal includes transforming said transient voltage signal into a conditioned signal by utilizing a set of resonance filters;
said set of resonance filters is configured to block frequencies associated with generating process plasma; and
said detection circuit comprises said set of resonance filters.

24. The method of claim 23, wherein:
processing of said transient voltage signal includes identifying said plasma unconfinement event via a threshold detector by comparing said conditioned signal to a threshold; and
said detection circuit comprises said threshold detector.

25. A sensor comprising:
a conductive substrate configured to be mounted on a surface of a chamber wall and internal to a plasma reactor;
an outer layer disposed on said conductive substrate, wherein said outer layer comprises
a first insulative layer disposed on said conductive substrate,
a second insulative layer disposed on said first insulative layer, and
an outer surface configured to be exposed to plasma in said plasma reactor;
an insulator, wherein a first portion of said insulator is configured to extend through said chamber wall, and wherein a second portion of said insulator is disposed between said outer layer and said chamber wall;
a contact connected to said conductive substrate, wherein said contact extends through said first portion of said insulator; and
a conductive element configured to connect said contact to a detection circuit,
wherein said conductive substrate extends outward away from said contact such that a portion of said outer surface is exposed to said plasma, and wherein said portion of said outer surface faces said chamber wall.

26. The sensor of claim 25, wherein:
at least one of said outer layer, said first insulative layer and said second insulative layer surround said conductive substrate;
said first insulative layer has a first corresponding capacitance;
said second insulative layer has a second corresponding capacitance; and
a portion of said outer layer is disposed between said conductive substrate and said insulator.

27. The sensor of claim 25, wherein said outer layer, said first insulative layer and said second insulative layer surround said conductive substrate.

28. The sensor of claim 25, wherein a portion of said outer surface is:
between (i) said chamber wall and (ii) said conductive substrate, said first insulative layer and said second insulative layer; and
exposed to said plasma.

29. The sensor of claim 25, wherein:
said second portion of said insulator extends outward away from said contact and between said conductive substrate and said chamber wall; and
said conductive substrate extends outward away from said contact and past an outer periphery of said second portion of said insulator such that there is a gap between said outer layer and said chamber wall providing surface area of said outer surface, between said conductive substrate and said chamber wall, exposed to said plasma.

* * * * *

UNITED STATES PATENT AND TRADEMARK OFFICE
CERTIFICATE OF CORRECTION

PATENT NO. : 8,894,804 B2
APPLICATION NO. : 12/747491
DATED : November 25, 2014
INVENTOR(S) : Jean-Paul Booth et al.

Page 1 of 1

It is certified that error appears in the above-identified patent and that said Letters Patent is hereby corrected as shown below:

On the Title Page:
Item (75)            Delete "les" and insert --Les--

In the Specification:
Column 6, Line 14    Delete "or" and insert --of--

Column 8, Line 65    Delete "of," and insert --of--

Column 10, Line 66   Delete "Films" and insert --films--

Signed and Sealed this
Twenty-first Day of April, 2015

Michelle K. Lee
*Director of the United States Patent and Trademark Office*